United States Patent [19]

Rao

[11] 4,347,587
[45] Aug. 31, 1982

[54] SEMICONDUCTOR INTEGRATED CIRCUIT MEMORY DEVICE WITH BOTH SERIAL AND RANDOM ACCESS ARRAYS

[75] Inventor: G. R. Mohan Rao, Houston, Tex.

[73] Assignee: Texas Instruments Incorporated, Dallas, Tex.

[21] Appl. No.: 97,104

[22] Filed: Nov. 23, 1979

[51] Int. Cl.³ .............................................. G11C 7/00
[52] U.S. Cl. .................................... 365/189; 365/221
[58] Field of Search ............... 365/149, 189, 221, 230, 365/238

[56] References Cited

U.S. PATENT DOCUMENTS

| 3,685,020 | 8/1972 | Meade | 365/230 |
|---|---|---|---|
| 4,044,339 | 8/1977 | Berg | 365/189 |
| 4,106,109 | 8/1978 | Fassbender | 365/221 |
| 4,198,697 | 4/1980 | Kuo et al. | 365/149 |

Primary Examiner—Stuart N. Hecker
Attorney, Agent, or Firm—John G. Graham

[57] ABSTRACT

A semiconductor memory device of the single-chip MOS/LSI integrated circuit type has both serial access and random access arrays on the same chip. When the device is addressed, if the address is in the random access portion then data input or output is the same as in dynamic RAM operation, but if the address is in the serial arrays then access is different. For a read operation a row containing the addressed data is transfered serially from the serial access portion to a shift register coupled to the random access array, then this row of data is transfered into the columns of the array and output is accomplished in the usual manner. The random access or serial access arrays may be loaded serially.

10 Claims, 4 Drawing Figures

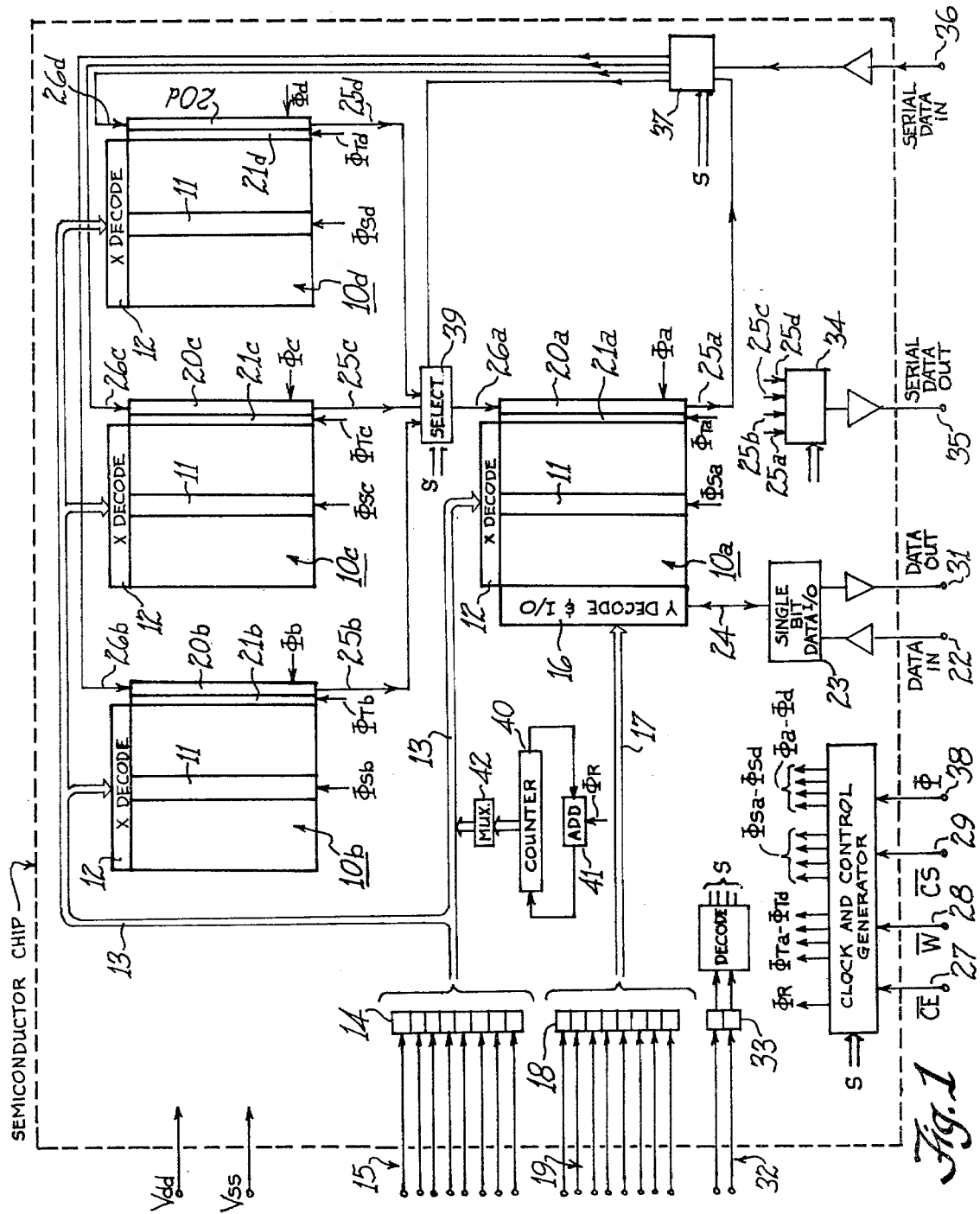

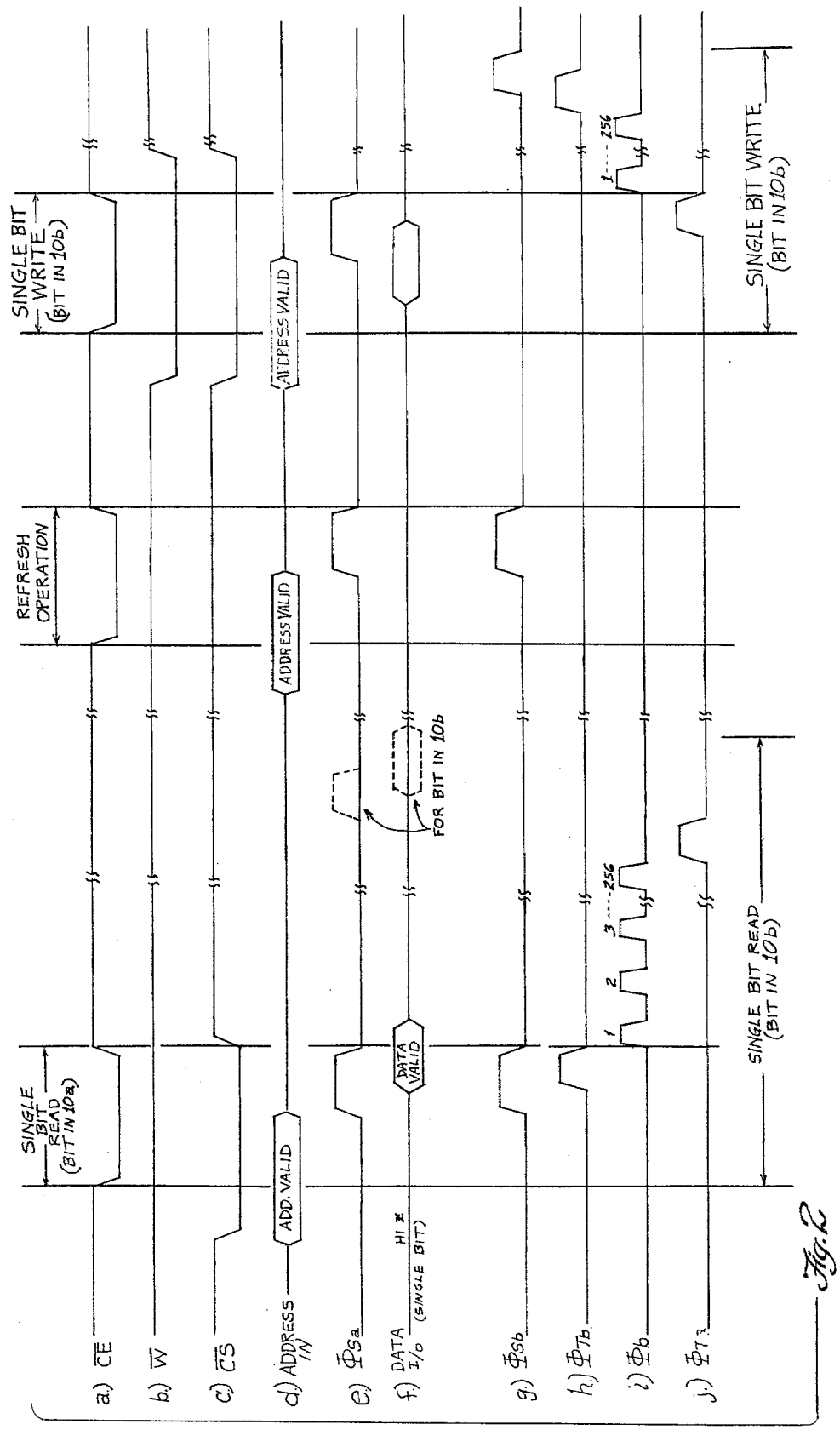

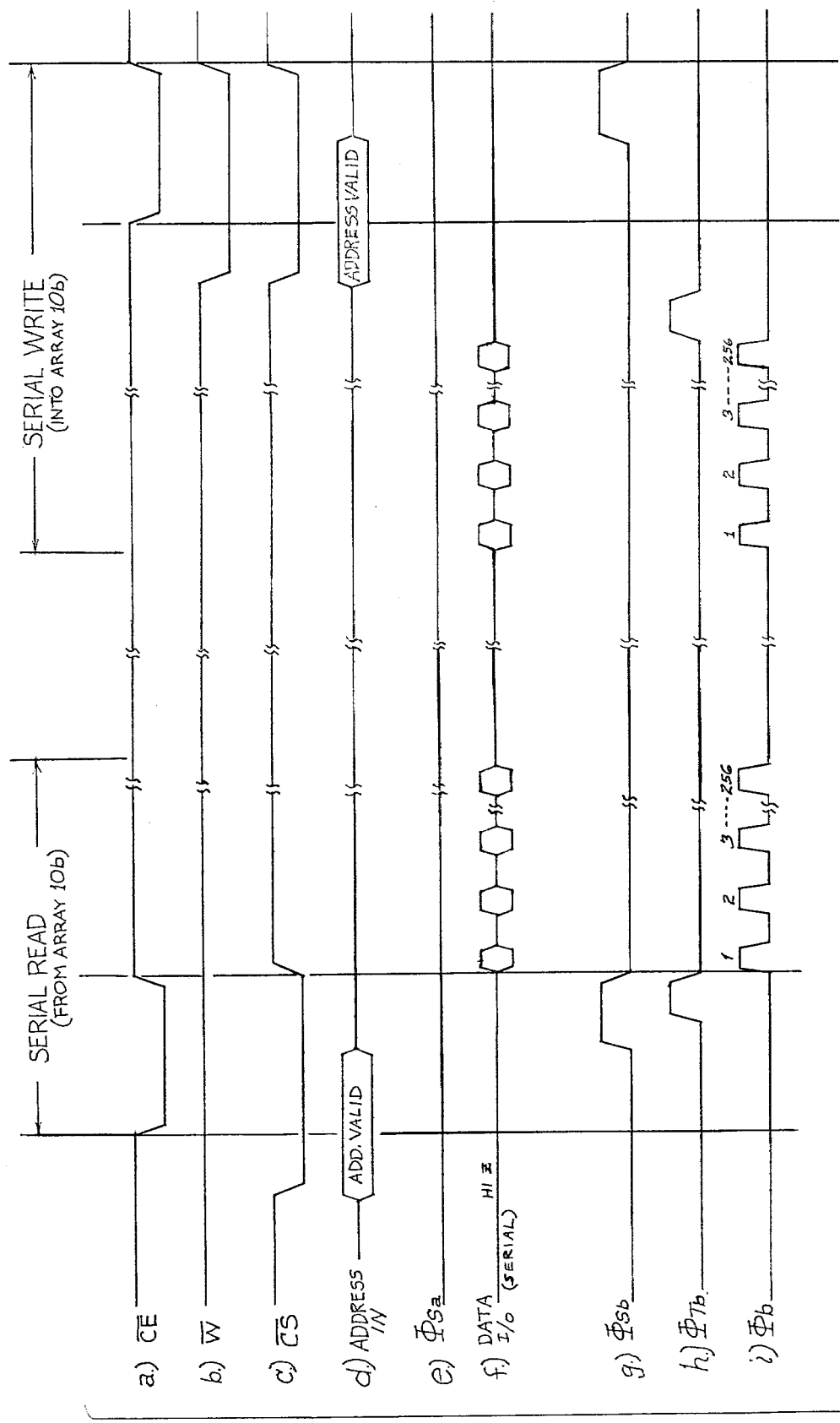

4,347,587

SEMICONDUCTOR INTEGRATED CIRCUIT MEMORY DEVICE WITH BOTH SERIAL AND RANDOM ACCESS ARRAYS

RELATED CASES

The subject matter of this application is related to that disclosed in co-pending applications Ser. No. 97,105, Ser. No. 97,106, and Ser. No. 96,957 (now U.S. Pat. No. 4,281,401), filed herewith and assigned to Texas Instruments.

BACKGROUND OF THE INVENTION

This invention relates to semiconductor integrated circuit devices and more particularly to a serial and random access system for an MOS/LSI read/write memory.

Semiconductor memory devices of the type made by the N-channel silicon-gate MOS process and employing one transistor dynamic cells are now very widely used in computers and digital equipment. The volume of manufacture of such devices has resulted in a continuing reduction in cost according to "learning curve" theory, and this trend will continue as volume increases. In addition, improvements in line resolution and other factors have made possible increases in bit density during the last few years from 1K through 4K and 16K to 64K bits for devices now in production, and 256K devices are being designed. This fact has further reduced the cost per bit for this type of computer memory, and cost reductions will continue.

Ordinarily a computer of any size, whether it is a main frame, a minicomputer, or a microcomputer, will have several different types of memory. These types may include cache, dynamic RAM, static RAM, EPROM, EAROM, ROM, buffer, magnetic bubble, CCD, several types of disc including fixed head and moving head disc, and magnetic tape. Generally the higher speed of access types are the most expensive and the lower speeds are cheapest, on a per bit basis. Other factors such as ease of programming, volatility, refresh overhead, size, power dissipation, etc., dictate choice of one type over another. One of the most common in current mainframe computers is moving head disc, which is relatively inexpensive, but the access time is slow. Fixed head disc has thus been used as a speed buffer between moving head disc and RAM, at a cost less than RAM but somewhat more than moving head disc.

Different manufacturing methods and equipment, different design efforts for product improvement, and different technology bases have caused the various types of computer memory to fail to take maximum advantage of the economics of scale. For example, one niche in the realm of memory is occupied by CCD's which are serial semiconductor devices adapted to the task of going from moving head disc to RAM, replacing fixed head disc. In spite of the fact that CCD's are basically similar to N-channel MOS RAM's, the vast design and manufacturing expertise available for the mainstream memory products shared by major semiconductor manufacturers has not been applicable to CCD's because of the different technologies. Thus, this memory product has not kept pace in the areas of manufacturing volume, cost reduction, and bit density increases. For this reason, computer equipment manufacturers have made use of standard dynamic RAM devices to simulate operation of CCD's to accomplish the function of buffering between moving head disc and RAM. This is somewhat cheaper, but the unused speed of dynamic RAM's results in unnecessary costs. These considerations resulted in the serial access memory device of pending applications Ser. No. 97,105, Ser. No. 97,106, and Ser. No. 96,957 (now U.S. Pat. No. 4,281,401), filed herewith and assigned to Texas Instruments.

An evaluation of the usage of various memory types by a CPU in typical computing systems shows that high speed RAM is not needed for direct interface with the CPU during substantial parts of commonly-used operations. Instead, high speed serial access memory is very useful in transfering blocks of data into cache or into the working registers of the CPU itself. Thus, in addition to high speed RAM, it would be desirable to have available high speed serial access memory devices which may be used as an alternative. The continuing investment in dynamic MOS RAM technology, plus the serial operation provided by CCD or serial access RAM of applications Ser. No. 97,105, Ser. No. 97,106 and Ser. No. 96,957 now U.S. Pat. No. 4,281,401, present the capability of combining serial and random access memory on a single chip with substantial cost advantages.

It is the principal object of this invention to provide a high speed combined serial and random access memory which is especially useful in semiconductor MOS/LSI devices. Another object is to provide serial and random access memory devices which are of lower cost and susceptible to volume production.

SUMMARY OF THE INVENTION

In accordance with one embodiment, a semiconductor memory device of the single-chip MOS/LSI integrated circuit type has both serial access and random access arrays on the same chip. When the device is addressed, if the address is in the random access portion then data input or output is the same as in dynamic RAM operation, but if the address is in the serial arrays then access is different. For a read operation a row containing the addressed data is transfered serially from the serial access portion to a shift register coupled to the random access array, then this row of data is transfered into the columns of the array and output is accomplished in the usual manner. The random access or serial access arrays may be loaded serially.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is an electrical diagram in block form of a semiconductor memory device which uses the features of the invention;

FIGS. 2a-2j and 2a-2i are graphic representations of voltage vs. time or other conditions vs. time existing for various parts of the device of FIG. 1.

DETAILED DESCRIPTION OF SPECIFIC EMBODIMENT

Figure 3:
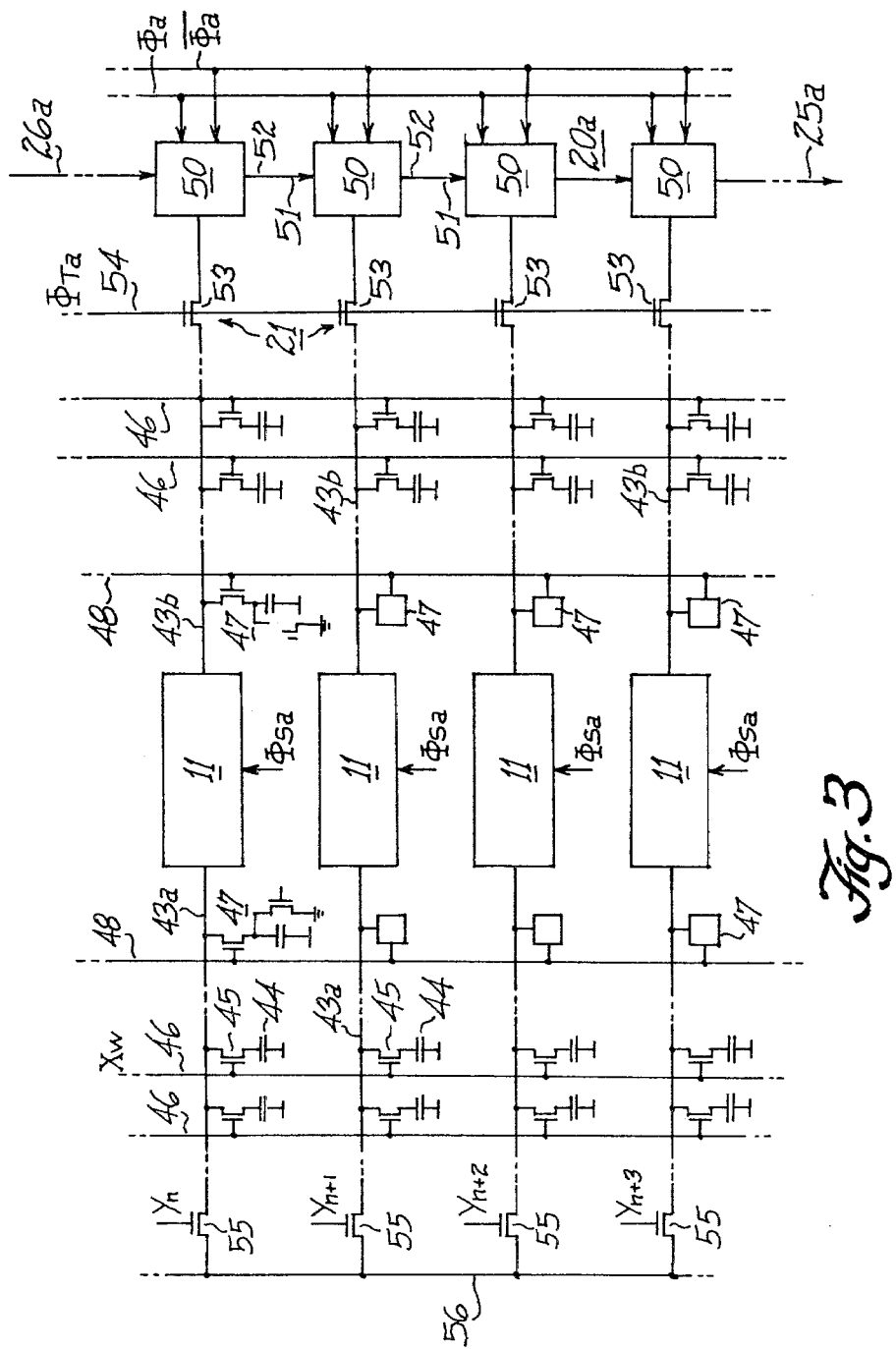
FIG. 3 is an electrical schematic diagram of one of the cell arrays in the device of FIG. 1.

Referring to FIG. 1, a memory device which may utilize the features of the invention is illustrated in block diagram form. This is a read/write memory organized with both serial access and random access arrays, both of which may use a cell array of the dynamic random access type or, alternatively, the serial access arrays may be of the CCD type. Typically, the device is made by an N-channel, self-aligned, silicon gate, double-level-polysilicon, MOS process. All of the memory device of FIG. 1 is included in one silicon chip of perhaps 1/20 of a square inch in size which usually would be mounted in a standard dual-in-line package. The device includes, for example, four arrays 10a, 10b, 10c and 10d, each having 65,536 memory cells. As in standard dynamic RAMs, each array is split into two halves of 32,768 cells each, in a regular pattern of 256 rows and 256 columns. There are 256 sense amplifiers 11 in the center of each array; these may be differential type bistable circuits made according to the invention disclosed and claimed in U.S. Pat. No. 4,081,701, issued to White, McAdams and Redwine, or Application Ser. No. 944,822 filed Sept. 22, 1978, (now U.S. Pat. No. 4,239,993) both assigned to Texas Instruments, or other similar sense amplifier circuits. Each sense amplifier is connected in the center of a column line, so 128 memory cells are connected to each side of each sense amplifier by a column line half. Usually, the chips require only a single 5V supply Vdd, along with a ground terminal Vss.

A row or X address decoder 12 is connected to receive an address and complements by sixteen lines 13 from eight address buffers or latches 14. The buffers 14 may be made according to the invention disclosed in pending application Ser. No. 953,145, filed Oct. 20, 1978 by Reese, White and McAlexander, (now U.S. Pat. No. 4,280,070) assigned to Texas Instruments. An eight-bit X address as TTL voltage levels is applied to inputs of the address buffers 14 by eight address input terminals 15. The X decoder 12 functions to select one of the 256 row lines in each array as defined by an eight-bit address on the input terminals 15. The X decoder 12 is shown split into four separate decoders, one for each of the four arrays 10a–10d, but in an actual chip layout the arrays may share a single decoder or two decoders. According to standard practice, dummy cells may be provided in each array on each side of the sense amplifiers 11.

A column or Y decoder and single-bit data I/O circuit 16 is associated with the array 10a and functions to select one of 256 column lines in this array for data in or data out. This decoder 16 receives an eight-bit address and its complements on sixteen lines 17 from eight address latches 18 which are like the latches 14. An eight-bit TTL level Y address is applied to these latches on inputs pins 19.

As thus far described, the memory is similar to a standard dymamic RAM; however, serial input/output using a shift register is provided, instead of or in addition to single bit, by the use of 256 bit serial shift registers 20a–20d used for each array 10a–10d, respectively. Each shift register may be loaded from the column lines of the corresponding array 10a–10d for a read cycle, or loaded into the column lines for a write cycle, by 256 transfer gates 21a–21d, respectively. Single-bit data input to the device is by a data-in terminal 22 which is connected through a buffer and an I/O circuit 23 to input/output line 24 for the Y decoder 16. Data is read out serially from the registers 20a–20d by lines 25a–25d, respectively, or data is written into the serial registers 20a–20d by lines 26a–26d, respectively. The shift registers 20a–20d are separately operated by clocks $\Phi a$–$\Phi d$, respectively, which are used to shift bits serially through the stages of the registers. For serial transfer, a write operation takes 256 cycles of the corresponding clock $\Phi a$–$\Phi d$ to load in 256 bits to fill up the 256 bits of the appropriate one of the registers 20a–20d. A control $\Phi Ta$–$\Phi Td$ functions to transfer data via gates 21a–21d from a serial register to the 256 column lines in the selected array 10a–10d. In this type of a serial write operation, the sense amplifiers 11 are then operated by $\Phi Sa$–$\Phi Sd$ to set the column lines at a full logic level, after which one row line (selected by the address in the latches 14) is actuated and the data forced into the memory cells of this row. A serial read operation starts with an address on the inputs 15 which is decoded to actuate one of the 256 X or row address lines by an Xw voltage (and a dummy cell on the opposite side of the sense amplifier). The sense amplifiers 11 are then actuated by a $\Phi Sa$–$\Phi Sd$ clock to force the column lines to a full logic level, and the transfer devices 21a–21d for the selected array are actuated by $\Phi Ta$–$\Phi Td$ to move the 256 bits from the selected row into the corresponding shift register 20a–20d. The shift clock $\Phi a$–$\Phi d$ then moves the 256 bits onto the appropriate output line 25a–25d in serial format requiring 256 of the appropriate one of the clock $\Phi a$–$\Phi d$ cycles.

The X and Y addresses must appear on the inputs 15 and 19 when a chip enable signal $\overline{CE}$ as in FIG. 2a is applied to an input 27. A read/write control $\overline{W}$ on an input 28 as seen in FIG. 2b is another control signal for the device, along with a chip select signal $\overline{CS}$ on input terminal 29 seen in FIG. 2c. These inputs are applied to clock generator and control circuitry 30 which generates a number of clocks and control signals to define the operation of various parts of the device. When $\overline{CE}$ goes low as seen in FIG. 2a, clocks derived from $\overline{CE}$ cause the buffers 14, 18 and 33 to accept and latch the eighteen bits then appearing on the input lines 15, 18 and 32. The row and column address must be valid during the time period shown in FIG. 2d.

Single-bit data output is from the array 10a via the Y decode 16, the line 24, the data I/O control 23, a tristate buffer, and a data output terminal 31, using circuitry as is commonly employed in standard dynamic RAM devices such as described in the below mentioned Electronics articles.

Selection of one of the four memory arrays 10a–10d is made by the two most significant address bits which are applied by pins 32 to two input buffers 33, constructed like the buffers 14 and 18. For example, when the two MSB's are "00," this represents the array 10a, and the data bit can be directly accessed in classic dynamic RAM fashion from or to the array 10a via the line 24 and decoder 16. If the two MSB's are "01," "10, " or "11," however, this represents the arrays 10b, 10c or 10d, respectively, and access must be indirect. For a read operation, the row containing the selected bit is transfered on $\Phi Tb$–$\Phi Td$ via gate 21b–21d to serial register 20b–20d in the appropriate one of the arrays 10b–10d, then serially via line 25b, 25c or 25d to input 26a and register 20a, from whence it is loaded as one of 256 bits through the cell array 10a and thus out via Y decode 16, line 24 and data out terminal 27. By not holding an X address Xw on the rows of the array 10a when the serial data enters from the register 20a, the data in the array 10a is maintained nondistructively. Similarly, if a single-bit write operation is used, if the address is in one of the arrays 10b–10d the input for single-bit operation must be through the array 10a.

In place of the dynamic RAM type arrays with serial registers for input/output as disclosed in pending applications Ser. No. 97,105, Ser. No. 97,106 and Ser. No. 96,957, (now U.S. Pat. No. 4,281,401) filed herewith, the arrays 10b–10d may be CCD's or other serial memory devices. From a process standpoint, however, it is preferable that the arrays 10b–10d be made by the same method as the dynamic RAM array 10a.

In addition to the single-bit data-in terminal 22 and data-out terminal 31, the device may have serial input/output. The outputs 25a–25d from the registers 20a–20d for the four arrays are shown connected through selector 34 and a tri-state buffer to a data-out terminal 35. The selector 34 is controlled by the decoded address in the latch 33. If only one of the shift clocks $\Phi a$–$\Phi d$ is activated at any given time, then no output selector 34 is needed. Likewise, a data input terminal 36 is connected through a suitable input buffer to the input of a selector gate 37, controlled by S, the decoded two-bit address in the latch 33, and thus to a selected one of the inputs 26a–26d.

For a read operation when the address bits in the two latch stages 33 is "00," meaning that the address is in the dynamic RAM array 10a, the $\overline{CE}$, $\overline{W}$, $\overline{CS}$ and address signals will be as seen in the left-hand parts of FIGS. 2a–2d. There will be no $\Phi Ta$ or $\Phi a$ clock produced by the clock generator 30. The sense amplifiers 11 are activated by $\Phi Sa$ (FIG. 2e), producing (after proper column decoding) a single-bit output of FIG. 2f to pin 31 via circuitry 16, 24 and 23. Likewise, for a write operation when the address is in array 10a, the right-hand parts of FIGS. 2a–2e are applicable, neither $\Phi Ta$ nor $\Phi a$ occur, and the data input via pin 22 occurs during the period seen in FIG. 2f. A refresh operation is as seen in the center part of FIGS. 2a–2f; refresh is the same as a read operation but no Y address occurs, no $\overline{CS}$, and there is no data-in or data-out on pins 22 or 31. One row in each of the arrays 10a–10d is refreshed at the same time by an X address along with $\Phi Sa$–$\Phi Sd$ clocks. The read, write and refresh operations for single-bit operations for the addresses in the array 10a are the same as for a standard dynamic RAM of the type in volume manufacture today by many companies in the semiconductor industry.

For a read operation when the address bits in the two latch stages 33 are "01," for example, meaning that the address is in serial I/O array 10b, the $\overline{CE}$, $\overline{W}$, $\overline{CS}$ and address inputs will be the same as above, seen in the left-hand parts of FIGS. 2a–2d. After Xw, which is the actuation of one of the 256 row lines in array 10b, the sense amplifiers 11 for this array are actuated by $\Phi Sb$ as seen in FIG. 2g. Then $\Phi Tb$ occurs as seen in FIG. 2h causing the 256 bits of data on the columns of array 10b to be transfered into the serial register 20b via the transfer gates 21b. The clock $\Phi b$ now begins as seen in FIG. 2i and continues for 256 cycles. The clock $\Phi b$ is supplied from a clock $\Phi$ coupled into the chip via a pin 38; the clock generator 30 produces selected ones of the clocks $\Phi a$–$\Phi d$ based on the address in the latch 33. The clock $\Phi b$ causes the serial register 20b to shift the 256 bits out onto the line 25b, one bit at a time, and thus to input 26a of the serial register 20a for the array 10a through a selector 39 controlled by S. The clock $\Phi a$ occurs at the same time as $\Phi b$ for this operation, so the data is shifted into the register 20a at the same time it is shifted out of the register 20b. After all 256 of the clock pulses of $\Phi b$ and $\Phi a$ have occurred, the clock generator 30 produces a transfer pulse $\Phi Ta$, seen in FIG. 2i, followed by actuation of the sense amplifiers by $\Phi Sa$, FIG. 2e. Xw does not occur, preserving the data in the memory cell of the array 10a. The selected one bit of the 256 bits of data is defined by the Y address still in the latches 18, so it is read out via circuitry 16, 24, 23 and pin 31 during the time seen in FIG. 2f (dotted).

In a write operation where the selected address is in one of the serial arrays, such as array 10b, the single bit data-in on the pin 22 is applied to the selected column in the array 20a via decoder 16. The $\Phi Sa$ and $\Phi Ta$ clocks cause the bit to the transfered to the register 20a, from which it is transfered to the corresponding register 20b of the array 10b by occurrence of 256 cycles of $\Phi a$ with $\Phi b$ as the output 25a will be connected to the input 26b by the selector 37. The $\Phi Tb$, $\Phi Sb$ and Xw signals then occur, storing the bit in the proper cell in the array 10b. This sequence is distructive with respect to the other data in the selected row of the array 10b, so the serial write operation is more useful than the single-bit write of FIG. 2 (right).

A serial write opertion begins with an address on only the pins 15 and 32 along with a $\Phi$ clock, as seen in FIG. 2i, without the $\overline{CE}$, $\overline{W}$ and $\overline{CS}$ signals occurring yet. This causes the 256 bits of input data on pin 36 to be shifted into the selected one (20b) of the serial registers 20a–20d. Then, a $\Phi Ta$–$\Phi Td$ signal occurs (only for the selected 20b followed by a $\overline{CE}$ signal of FIG. 2a, a W signal as in FIG. 2b, and a $\overline{CS}$ signal of FIG. 2c (all right-hand side). This results in a $\Phi Sb$ signal for 10b, the selected one of the arrays 10a–10d, so the 256 bits are written into the row selected by the Xw signal.

A serial read operation begins with an address on only the pins 15 and 32, along with $\overline{CE}$, $\overline{W}$ and $\overline{CS}$ signals as seen in the left-hand side of FIGS. 2a–2d. This produces an Xw voltage on one row line, then one of the $\Phi Sa$–$\Phi Sd$ signals for the selected array, followed by the corresponding one of the $\Phi Ta$–$\Phi Td$ signals, ($\Phi Tb$ in FIG. 2h). The 256 bits from the selected row are now in one of the serial registers 20a–20d. The clock $\Phi b$ begins, as in FIG. 2'i, resulting in one of the clocks $\Phi a$–$\Phi d$ shifting the data out serially via the selector 34 and the pin 35, requiring 256 cycles.

Refresh can be produced in all chips by an X address on the lines 15, a low $\overline{CE}$ signal on the line 27, and a read or high condition on the W line 28, with the $\overline{CS}$ signal high. This may be done during the $\Phi$ clock sequence for a read or write operation. Further, a refresh address counter 40 can be included on the chip, to be incremented by adder logic 41 every time a refresh signal $\Phi R$ condition ($\overline{CE}$ low, $\overline{W}$ and $\overline{CS}$ high) occurs. A multiplexer 42 inserts the refresh counter address onto the lines 13, and the $\Phi Sa$–$\Phi Sd$ signals are produced by the clock generator 30, producing refresh of the selected row in all four arrays 10a–10d. This mode of refresh using an on-chip counter provides essentially static operation and is described in co-pending application Ser. No. 918,891, filed June 26, 1978, (now U.S. Pat. No. 4,207,618), assigned to Texas Instruments. In any event, implementing refresh during a $\Phi R$ sequence provides a refresh operation which is essentially transparent to the CPU.

In FIG. 3, a portion of the cell array 10a and associated shift register stages are shown in schematic form. The cell arrays 10b–10d and their associated serial access registers 20b–20d are the same as the array 10a of FIG. 3 except that the random access part such as decoder and I/O circuitry 16 is not included. That is, the array 10a is constructed for both random and serial access, but the arrays 10b–10d are constructed for only serial access. Because of reduced speed requirements, the arrays 10b–10d can be physically smaller than array 10a due to less strigent demands, but otherwise the cell arrays, sense amplifiers and serial access registers are the same. In FIG. 3, four of the 256 identical sense amplifiers 11 are shown positioned at the center of the array and connected to four column line halves 43a or 43b. Connected to each column line half 43a or 43b are 128 one-transistor cells each having a storage capacitor 44 and a transistor 45. The cell array is generally of the type described in articles in Electronics magazine of Sept. 13, 1973, at pp. 116–121; Feb. 19, 1976, at pp. 116–121; May 13, 1976, at pp. 81–86, and Sept. 28, 1978, at pp. 109–116, while cells are of the type described in pending U.S. Pat. applications Ser. No. 648,594 filed Jan. 12, 1976 and Ser. No. 722,841, filed Sept. 13, 1976 (now U.S. Pat. No. 4,290,092) by C-K Kuo, both assigned to Texas Instruments, or U.S. Pat. No. 4,012,757 or said Electronics articles. Row lines 46 which are the outputs of the row decoders 12 are connected to the gates of all of the transistors 45 in each row; there are 256 identical row lines 46 in the array 10a. Also connected to each column line half 43a or 43b is a dummy cell 47 which consists of a storage capacitor, an access transistor and a predischarge transistor. The gates of all dummy cells in a row are connected to a line 48. For example, if the Xw address voltage selects one of the lines 46 on the left, the associated transistor 45 is turned on to connect the capacitor 44 for this selected cell to the column line half 43a, while at the same time the dummy cell select line 48 on the opposite side is activated, connecting the capacitor in one of the cells 47 to the column line half 43b.

The serial I/O register 20a is composed of shift register stages 50 positioned on one side of the cell array. Alternatively, the shift register may be split in halves, one-half on each side of the cell array as disclosed in application Ser. No. 96,957 (now U.S. Pat. No. 4,281,401). The input 51 of each stage is connected to receive the output 52 of the next preceding stage, in the usual manner. The shift register is operated by a two phase clock $\Phi a$, $\overline{\Phi a}$ derived from the clock $\Phi a$. That is, the clock $\Phi$ [supplied from external to the chip] is used to generate all the clocks $\Phi a$–$\Phi d$, which are used to generate clocks as $\Phi a$ in phase opposition, then each of these sets such as $\Phi a$ and $\overline{\Phi a}$ is used to operate the shift register. The input 26a of the stages 50 is from the data-in selector circuit 39, and the output 25a from the last of the stages 50 goes to the data-out selector circuit 37. The transfer gates 21a consist of 256 identical transistors 53 having their source-to-drain paths in series between the column line halves 43b and the shift register stages 50. The gates of the transistors 53 are connected by a line 54 to the $\Phi Ta$ source.

The Y decode and I/O circuitry 16 includes 256 transistors 55 each having its source-to-drain path in series between one of the column line halves 43a and a line 56 going to input/output line 24. The individual gates of the transfer transistors 55 receive the outputs of a standard one-of-256 decode circuit which selects only one of the transistors 55 to be turned on in response to the Y address on lines 17. This input/output arrangement may of course be connected on the same side of the array as the shift register states 50.

It is noted that the timing of the $\Phi Ta$, $\Phi sa$ and $Xw$ signals is different for serial read, refresh and write. These voltages are seen in FIG. 2. Read and refresh are the same except refresh has no $\Phi Ta$. The reversal of timing is necessary because of the reversed sequence. In the case of a serial read cycle the data from a row of the memory capacitors 44 is transferred through a row of transistors 45 by the Xw voltage to the column lines 43a,b then detected by the sense amplifiers 11 at $\Phi Sa$, then loaded through the transfer gates 21a at $\Phi Ta$ to the shift register 20a. The opposite must occur for the write cycle where the transfer devices 21a must turn on first at $\Phi Ta$ as the data in the shift register is transfered to the column lines 43b, then data is sensed at $\Phi Sa$, after which Xw goes high momentarily to turn on a selected row of transistors 45 and thus load the data state of the serial shift register into the row capacitors 44 in the cell array 10a. The proper sequence is selected by sensing the $\overline{W}$ command at the start of a cycle, just as an address is sensed, and employing this information in the clock generators 30. $\Phi Ta$, generated from occurrence of $\overline{CE}$, $\overline{CS}$ and $\overline{W}$, is switched in timing between early or late compared to $\overline{CE}$ depending upon whether $\overline{W}$ is low or high.

Although shown with a 64K random access array and three 64k serial access arrays, other combinations may be optimum for various memory configurations and typical software implemented on a given CPU.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore, contemplated that the appended claims will cover any such modifications or embodiments as fall within the true scope of the invention.

What is claimed:

1. A memory device comprising a body of single crystal semiconductor material, a random-access read/write array formed in one face of said body, a serial-access read/write memory also formed in said one face, first addressing means for receiving and decoding a row address for selecting a row in both said memory array and said memory, second addressing means for receiving and decoding a column address for selecting a column in said random access memory array, third addressing means for receiving an address selecting between the random-access memory array or said serial-access memory, each said memory array and said memory having a serial access register, means to selectively clock the serial access registers of said memory array and said memory means, for connecting a data output from the serial access register of the serial-access memory to a data input of the random access memory array, and single-bit input/output access means coupling said random-access memory array to input/output connections for said body.

2. A device according to claim 1 wherein the serial-access memory includes a plurality of serial-access memory array each of which has a serial access register.

3. A device according to claim 1 wherein the random-access memory array is an array of M rows and N columns and said serial-access memory includes an array of M rows and N columns, where M and N are integral powers of two, and said serial access registers are shift registers of N stages.

4. A device according to claim 3 wherein the serial-access memory includes a plurality of said arrays of M rows and N columns, each having a separate serial access register, and said means for connecting includes selector for connecting the output of only one of the serial access registers to the said input of the serial access register of the random-access memory array.

5. A device according to claim 4 wherein the random access memory array and the serial access memory are both arrays of rows and columns of dynamic one-transistor MOS memory cells, and each array has a differential bistable sense amplifier in the center of each column.

6. A device according to claim 5 wherein each said shift register includes a number of stages N equal to the number of column and each stage is coupled to corresponding column by a transfer gate.

7. A memory device comprising a body of semiconductor material, a random-access array of rows and columns of memory cells formed in one face of said body, a serial-access memory containing a plurality of rows of memory cells also formed in said one face, first addressing means in said one face receiving and decoding a row address for selecting a row in both said memory array and said memory, second addressing means in said one face for receiving and decoding a column address for selecting a column in said random array, third addressing means in said one face for receiving an address selecting between the random-access memory array or said serial-access memory, each said random access memory array and said serial access memory having a serial register, means in said one face for connecting a data output from the serial register of the serial-access memory to a data input of the serial register of the random access memory array, and single-bit access means in said one face coupling said random-access memory array to access means for said body.

8. A device according to claim 7 wherein the random-access memory array is an array of M rows and N columns and said serial-access memory includes an array of M rows and N columns, where M and N are integral powers of two, and said serial access registers are shift registers of N stages.

9. A device according to claim 8 wherein the serial-access memory includes a plurality of said arrays of M rows and N columns, each having a separate serial access register, and said means for connecting includes selector means for connecting the output of only one of the serial access registers to the said input of the serial access register of the random-access memory array.

10. A device according to claim 9 wherein the random access memory array and the serial access memory are both arrays of rows and columns of dynamic one-transistor MOS memory cells, each array having a different bistable sense amplifier in the center of each column, each said shift register including a number of stages N equal to the number of columns, and each stage being coupled to a corresponding column by a transfer gate.

* * * * *